United States Patent

Wu et al.

Patent Number: 5,563,423
Date of Patent: Oct. 8, 1996

[54] DARK CURRENT-FREE MULTIQUANTUM WELL SUPERLATTICE INFRARED DETECTOR

[75] Inventors: Chan-Shin Wu, Torrance; Robert N. Sato, Palos Verdes Estates; Cheng P. Wen, Mission Viejo, all of Calif.

[73] Assignee: Hughes Aircraft Company, Los Angeles, Calif.

[21] Appl. No.: 431,382

[22] Filed: Apr. 28, 1995

Related U.S. Application Data

[63] Continuation of Ser. No. 746,258, Aug. 15, 1991, abandoned.

[51] Int. Cl.$^6$ ............... H01L 31/0304; H01L 31/101
[52] U.S. Cl. ............... 257/21; 257/22; 257/17; 257/189; 257/441
[58] Field of Search ............... 357/16, 30, 4; 257/21, 17, 22, 789, 441

[56] References Cited

U.S. PATENT DOCUMENTS 5,031,013  7/1991  Choi ............... 357/16

FOREIGN PATENT DOCUMENTS 0275150  1/1988  European Pat. Off. .

OTHER PUBLICATIONS

Gourley et al *Appl. Phys Lett* 49 (2), 14 Jul. 86 "Diffusion Dynamics . . . Superlattices".
Levine, B. F. et al., "High-detectivity D*—1.0×10$^{10}$ cm √Hz/W GaAs/AlGaAs multiquantum well λ=8.3 μm infrared detector", *Appl. Phys. Lett.* 53(4), 25 Jul. 1988, pp. 296–298.

*Primary Examiner*—Jerome Jackson, Jr.
*Attorney, Agent, or Firm*—W. C. Schubert; W. K. Denson-Low

[57] ABSTRACT

An improved multiquantum well superlattice photodetector (10) for detecting long wavelength infrared radiation. Electron transport in a first excited energy state is enhanced in barrier layers (20) of the superlattice (16) by lowering the potential energy barriers of the barrier layers (20) to a predetermined level below the first excited energy state. The tunneling component of the dark current in a multiquantum well photodetector (10) may be substantially eliminated by placing a blocking layer (22) at one end of the superlattice (16). The thickness of the blocking layer (22) is also substantially greater than that of the barrier layers (20) of the superlattice (16) to prevent charge carriers which tunnel through the superlattice (16) from reaching the collector contact. The blocking layer (22) also has a potential energy barrier having a height at a level higher than that of the barrier layers (20) of the superlattice (16).

31 Claims, 2 Drawing Sheets

DARK CURRENT-FREE MULTIQUANTUM WELL SUPERLATTICE INFRARED DETECTOR

This is a continuation of application Ser. No. 746,258 filed Aug. 15, 1991, abandoned.

TECHNICAL FIELD

The present invention relates generally to photodetectors fabricated from semiconductor materials. More specifically, the present invention relates to an improved multiquantum well photodetector having a reduced dark current.

BACKGROUND ART

In order to improve the signal-to-noise ratio and the sensitivity of photodetectors, it is important to limit dark current output. The detection of long wavelength and low background infrared radiation is particularly difficult with conventional multiquantum well photodetectors due to the presence of a relatively large dark current. High dark currents also limit the dynamic range and increase the power dissipation of these devices. In the fabrication of focal plane arrays, power dissipation is a major concern due to the need for additional heat dissipation control.

Semiconductor photodetectors having multiple quantum wells in a superlattice structure are known in the art. A superlattice is typically fabricated by molecular beam epitaxy or metalorganic chemical vapor deposition techniques to form a multilayered heterojunction structure. The thickness of each active layer is reduced to the order of carrier de Broglie wavelength such that a series of discrete energy levels are produced, A typical superlattice photodetector may include a plurality of gallium arsenide (GaAs) layers alternating with aluminum gallium arsenide (AlGaAs) layers. Each period of the superlattice thus comprises one GaAs layer and one AlGaAs layer. The GaAs layers are heavily doped n-type to form the quantum well layers which are positioned between the AlGaAs barrier layers. The conduction band edge of the barrier layer material is above the conduction band edge of the quantum well layers such that the quantum wells are periodic. It is know that the height of the energy barriers of the barrier layers can be controlled by adjusting the mole fraction of aluminum to confine electrons at selected energy levels in the quantum wells. In order to reduce thermionic emission of electrons from the quantum wells, these devices are operated at low temperatures according to the detection wavelength.

In operation, an electrical bias is applied perpendicular to the alternating barrier and quantum well layers. In the absence of illumination, this produces a current known as the dark current. Dark current results primarily from quantum mechanical tunneling of electrons through the potential barriers of the barrier layers. Upon illumination by photons of the appropriate energy, electrons are excited out of the quantum wells by transitions between energy levels. The photoemission of electrons from the quantum wells increases the conductivity of the device. Thus, it will be appreciated that these devices can be used to generate a signal which is proportional to the magnitude of the detected radiation.

One such device is disclosed in European Patent No. 275-150-A, wherein a photodetector having a superlattice is provided for infrared radiation detection. Electrons in the quantum wells have two bound states. Incident infrared radiation produces intersub-band absorption between the ground state and the excited state. The applied bias, the height of the potential energy barriers of the barrier layers, and the spacing of the energy states in the quantum well layers are set such that electrons in the excited state have a high tunneling probability. A signal is produced by tunneling of the photoexcited electrons through the potential barriers of the barrier layers. In one embodiment, energy levels of neighboring wells are matched to optimize tunneling of photoexcited electrons while inhibiting dark current tunneling.

Other superlattice photodetectors have been designed which do not rely on photoexcited tunneling for the signal current. These devices are based on the recognition that quantum well structures have finite barrier heights and that permissible energy states exist above the potential barrier of the barrier layers, i.e., in the continuum state of the superlattice. B. F. Levine and others described a photodetector of this type in "High-Detectivity $D^*=10^{10}$ cm, $\sqrt{Hz}/W$ GaAs/AlGaAs Multiquantum Well $\lambda=8.3$ µm Infrared Detector," *Appl.Phys.Lett.*, 53(4), 25 July 1988. The detector is a 50 period GaAs/AlGaAs superlattice grown on a semi-insulating GaAs substrate which is sandwiched between contact layers. One advantage of this type of device is its ability to control peak absorption wavelength. This is achieved by varying the dimensions of the quantum well layers and the barrier layers. The quantum wells contain a single bound state. Through photoemission of quantum well electrons into the continuum state while the superlattice is biased, electrons travel above the potential barriers toward the collector contact rather than through the barriers by quantum mechanical tunneling. Assuming an adequate mean-free path, the photoexcited carriers produce a signal representative of photon absorption in the quantum well layers.

Although multiple quantum well structures provide higher absorption efficiencies than single-well devices, a larger bias voltage is also required. This, in turn, increases the dark current produced by conventional superlattice photodetectors. Although the thermionic emission component of the dark current can be effectively minimized by operating at low temperatures, the tunneling current, which is increased by sequential resonant effects and electron hopping, produces a significant dark current. As stated, in applications requiring the detection of long wavelength and low background infrared radiation, the dark current is a major problem in the operation of conventional multiquantum well photodetectors. Therefore, it is important to reduce the tunneling component of the dark current.

One solution proposed by others to reduce dark current is to increase the thickness of each of the individual barrier layers of the superlattice. Since photoconduction is not achieved through tunneling, thin barriers are not necessary from the standpoint of optimizing tunneling current. More specifically, in the aforementioned photodetector described by Levine and others, 300 angstrom AlGaAs barrier layers and 40 angstrom GaAs quantum well layers were arranged to form a 50 period superlattice. By increasing the barrier width from 140 to 300 angstroms and the barrier height from 160 mV to 250 mV, the dark current was reduced by several orders of magnitude. This reduction in dark current resulted from a decrease in electron tunneling through the thick barrier layers. However, this method of decreasing the dark current suffers from several serious limitations.

Photodetector performance is based primarily on quantum efficiency, response time and sensitivity. Although increasing the thickness of the superlattice barrier layers reduces dark current, this limits the quantum efficiency of the detector. It will be appreciated that the barrier layers represent the low-mobility portion of the superlattice structure. Thus, if barrier layer thicknesses are substantially increased to reduce the dark current, electron mobility through the superlattice structure is decreased.

The high potential barrier of the proposed thick barrier layers also produces undesirable effects. More specifically, as the separation between the continuum state and the barrier height decreases, scattering of the photoexcited electrons increases in the barrier region, which reduces carrier mobility. In addition, as the barrier height approaches the energy level of the continuum state, some photoexcited electrons flow in opposition to the applied field. As a result, the signal-to-noise ratio decreases due to the increase in noise and the reduction in the number of electrons which reach the collector contact.

It is also known that radiation hardness is often an important characteristic of multiquantum well superlattice infra red detectors. More specifically, radiation-hard devices are required in space applications due to the high levels of gamma and other ionizing radiation.

In addition to the foregoing work by others, in U.S. Pat. No. 4,645,707, a semiconductor device is disclosed which includes two superlattices separated by a centrally disposed barrier layer which has a lower transmission coefficient than the barrier layers of the superlattices. It is stated that the central barrier layer is thicker than the barrier layers of the superlattices. The semiconductor device exhibits negative differential conductance due to voltage dependent discontinuities between energy minibands of the two superlattices. The device is a tunneling current device and is not a photodetector.

In contrast to the prior art suggestion of increasing the thicknesses of the superlattice barrier layers, in U.S. Patent Application Ser. No. 457,613, filed Dec. 27, 1989, now U.S. Pat. No. 5,077,593 issued on Dec. 31, 1991, which was assigned to the assignee of the present invention and which is incorporated herein by reference, the inventors of the present invention disclose a multiquantum well superlattice infrared detector in which tunneling current is prevented by a single, thick blocking layer positioned between the superlattice and the collector contact. More specifically, the photodetector disclosed therein includes a plurality of alternating quantum well layers and barrier layers arranged to form a superlattice. A blocking layer of barrier material is provided between the superlattice and the collector contact. The blocking layer thickness is selected such that it substantially eliminates the tunneling current component of the photodetector dark current. The blocking layer is substantially thicker than the individual barrier layers of the superlattice. Electrons tunneling through the barrier layers which would otherwise contribute to the dark current of the photodetector are blocked by the presence of the thick blocking layer. By blocking tunneling current in this manner through the use of a single blocking layer, dark current is reduced without compromising quantum efficiency.

In order to further enhance the performance of the aforementioned end-blocked multiquantum well superlattice infrared detector and other multiquantum well superlattice detectors, the present invention provides several improvements which increase the quantum efficiency and decrease the generation of noise in these devices.

One object of this invention is to provide several techniques for improving the performance of multiquantum well superlattice infrared detectors generally.

Another object of the present invention is to provide a low dark current end-blocked multiquantum well photodetector in which electron transport in the continuum energy level is optimized.

Still another object of the present invention is to provide an improved end-blocked multiquantum well photodetector having a low dark current in which quantum efficiency is improved by the use of a materials system which is superior to GaAs/AlGaAs.

It is still a further object of the present invention to provide an end-blocked multiquantum well photodetector which is particularly efficient in the detection of long wavelength and low background infrared radiation with virtually no power dissipation.

Still another object of the present invention is to provide an improved, low dark current, end-blocked multiquantum well photodetector for use in infrared detector focal plane arrays.

SUMMARY OF THE INVENTION

In one aspect the present invention provides a multiquantum well superlattice infrared detector which includes a plurality of quantum well layers and barrier layers arranged to form a superlattice. The conduction band edges of the barrier layers are separated from the first excited state of electrons in the quantum wells by a preselected minimum energy difference which significantly reduces electron scattering and deflection of electrons at the barrier layers. This separation is achieved by reducing the thickness of the quantum layers to raise the energy level of the first excited state and by lowering the barrier conduction band edge by adjusting the mole fraction of various materials in the superlattice. The energy spacing between the ground and first excited state necessary for detecting long wavelength infrared radiation is maintained by reducing the thickness of the barrier layers. This reduction in barrier layer thickness also broadens the miniband width which improves spectral response. By reducing the thickness of both the barrier layers and the quantum well layers, the radiation hardness of the superlattice is also increased. By utilizing an InGaAs/GaAs or InGaAs/AlGaAs superlattice structure, electron mobility is further enhanced.

In a GaAs/AlGaAs multiquantum well superlattice infrared photodetector made in accordance with the present invention, the first excited state of electrons in the quantum wells is raised by reducing the thickness of each GaAs quantum layer and the barrier heights are reduced by decreasing the mole fraction of aluminum in the AlGaAs layers. This produces the desired energy separation between the barrier potentials and the miniband. The proper spectral response is maintained by reducing the thickness of the AlGaAs layers which also serves to increase the width of the miniband and to increase electron mobility through the superlattice. A blocking layer of AlGaAs having a greater aluminum content than that of the barrier layers is preferably provided.

In InGaAs/GaAs and InGaAs/AlGaAs multiquantum well superlattice infrared photodetectors made in accordance with the present invention, the miniband is raised by reducing the thickness of the InGaAs quantum layers. The separation between the miniband and barrier potential is reduced by reducing the concentration of indium in InGaAs/GaAs devices. By reducing the mole fraction of indium and/or reducing the mole fraction of aluminum in InGaAs/AlGaAs devices, the relative barrier height is similarly reduced. In the InGaAs/GaAs device a AlGaAs blocking layer is preferably provided. In the InGaAs/AlGaAs device, a blocking layer of AlGaAs having a greater aluminum content than that of the barrier layer is preferably provided.

In general, where barrier layers are formed of $Al_xGa_{1-x}As$ in the present invention, x is from about 0.0 to about 0.25. Where the blocking layer is formed of $Al_xGa_{1-x}As$, x is from about 0.1 to about 0.35.

In the present invention, the blocking layer is preferably placed at the end of the multiquantum well superlattice structure, with the blocking layer and superlattice positioned between contact layers. One of the contact layers is in turn disposed on a semi-insulating semiconductor substrate. Via the contact layers, an electrical bias is applied to the photodetector across the contact layers perpendicular to the superlattice layers. Photons of the appropriate wavelength incident on the surface of the substrate are absorbed in the quantum well layers of the superlattice, causing photoexcitation of electrons confined in the quantum wells. These photoexcited electrons move to higher energy states in an energy continuum above the potential barriers of the barrier layers and the blocking layer where they move one mean-free path to the positively biased contact layer. The conductivity of the device is thereby increased by the presence of the photoexcited carriers in the continuum, producing a signal proportional to photon absorption. Electrons in the ground state (which is near the top of the barrier potential due to the reduction in quantum layer thickness) which would otherwise tunnel through the barrier layers and contribute to the dark current of the photodetector are blocked by the presence of the blocking layer, the potential barrier of the blocking layer being higher than that of the individual barrier layers. In this manner, quantum efficiency is greatly increased with the tunneling current component of the dark current being substantially eliminated.

DESCRIPTION OF THE PREFERRED EMBODIMENTS

Figure 1:
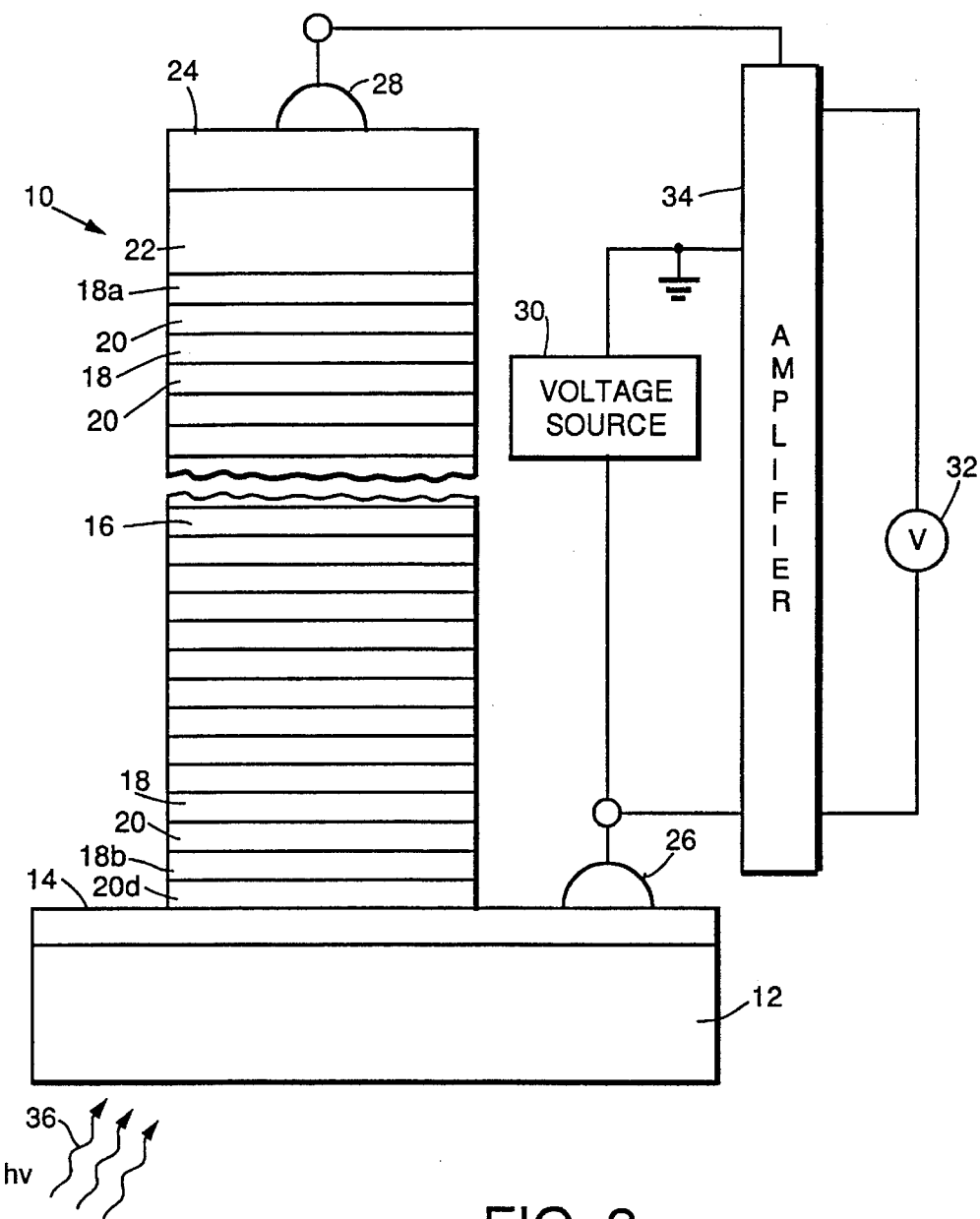
FIG. 1 is a schematic representation of a photodetector in accordance with the present invention.

Referring now to FIG. 1 of the drawings, photodetector 10 is shown comprising substrate 12 on which contact layer 14 is disposed. It should be noted that the figures are schematic, that they are not drawn to scale, and that like numerals designate like parts. The semiconductor material from which substrate 12 is fabricated transmits incident radiation of the wavelength to be detected.

Figure 2:
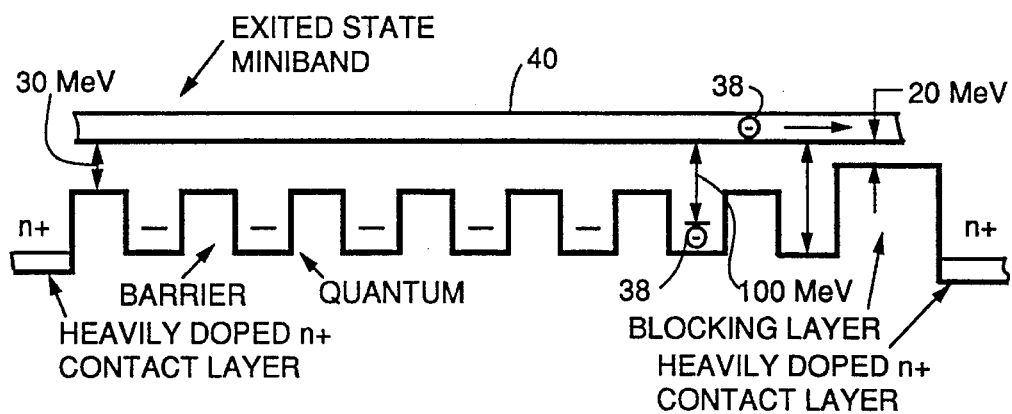
FIG. 2 is an example of a simplified partial energy band diagram for the detector illustrated in FIG. 1 with no applied bias.

As will be understood by those skilled in the art, the various semiconductor layers of photodetector 10 are epitaxial layers which are preferably formed by either molecular beam epitaxy or metalorganic chemical vapor deposition. Superlattice 16 is shown disposed on contact layer 14 and comprises multiple heterostructure layers of semiconductor materials having alternating conductivities. More specifically, superlattice 16 includes a plurality of quantum well layers 18 interleaved between a plurality of barrier layers 20. As shown in FIG. 2 of the drawings which is a partial energy diagram of the conduction band edge of the various layers of photodetector 10, the conduction band edge of the barrier layers, i.e., the height of the potential energy barriers, is above the conduction band edge of the alternating quantum well layers but is maintained below the continuum state by a predetermined energy difference, as will be explained more fully herein.

The preferred materials for use in fabricating photoconductor 10 are indium gallium arsenide (InGaAs) quantum well layers 18 and gallium arsenide (GaAs) barrier layers 20. In general, InGaAs/GaAs superlattice structures have better electron mobility and velocity than GaAs/AlGaAs. This in turn allows InGaAs/GaAs photodetectors made in accordance with the present invention to be operated at lower bias voltages than the same devices fabricated from GaAs/AlGaAs. By decreasing the requisite bias voltage in this manner, dark current (which increases in proportion to the bias voltage) is further reduced. Although the addition of indium increases the lattice mismatch between the superlattice layers, strain in the present invention is not significant due to the low mole percent of indium in the quantum well layers.

It is to be understood that although this description of the preferred embodiments of the invention describes an end-blocked multiquantum well superlattice infrared detector, several of the inventive concepts of the present invention are equally applicable in the design of multiquantum well superlattice photodetectors which do not include an end-blocking layer. The suitability of such devices will depend on the particular application.

As stated, in order to achieve the improved performance characteristics of photodetector 10 in accordance with the present invention, a minimum energy separation between the first excited state miniband and the conduction band edge of the barrier layer is established which significantly reduces electron scattering and deflection. This separation is preferably at least 30 meV and is generally between about 30 meV to 60 meV. This energy separation is attained in the present invention by raising the energy level of the first excited state miniband and lowering the barrier potential of the barrier layers. In order to raise the energy level of the first excited state, the thickness of quantum well layers 18 is reduced. In the present invention, quantum well layers 18 have a thickness or width, i.e., the distance through which electron transport occurs, less than about 45 angstroms and generally between about 30 and about 45 angstroms. In general, a reduction of 5 angstroms raises the energy level of the first excited state about 10 meV.

In addition to raising the energy level of the continuum state in this manner, the desired separation between the miniband and the barrier potential is achieved in the present invention by lowering the barrier potential. The barrier potential is lowered in the present invention by adjusting the mole fraction of various constituents of the superlattice structure. More specifically, in the case of InGaAs/GaAs superlattice structures, the barrier potential of the barrier layers is lowered by reducing the mole fraction of indium. That is, where $In_xGa_{1-x}As$ is utilized as the quantum well layer materials, x is preferably less than 0.2 and will generally be between 0.1 and 0.2.

Where photodetector 10 includes a superlattice structure 16 comprising quantum layers 18 of GaAs and barrier layers 20 of AlGaAs, the barrier height is reduced by reducing the mole fraction of aluminum. Thus, $Al_xGa_{1-x}As$ layers are utilized where x is less than about 0.25 and generally between about 0.15 and about 0.25. Similarly, where superlattice 16 comprises quantum well layers 18 of InGaAs and barrier layers 20 of AlGaAs, the relative barrier height is lowered by either reducing the mole fraction of indium and/or reducing the mole fraction of aluminum. For an InGaAs/AlGaAs structure, x in the $In_xGa_{1-x}As$ layer is preferably less than 0.2 and generally between about 0.1 and 0.2 and, in the $Al_xGa_{1-x}As$ layer, x is preferably less than 0.1 and generally between about 0.0 and 0.1. It will be appreciated that the GaAs/InGaAs devices are less preferable from the standpoint of electron mobility, but that a low mole fraction (less than 10%) of aluminum increases electron mobility in these devices. Other semiconductors such as III–V, IV—IV and II–IV may also be suitable.

In many instances, in order to attain the desired spectral response, the energy gap between the ground state and first excited state of electrons in quantum well layers 18 must be adjusted. This is achieved in the present invention by decreasing the thickness of barrier layers 20 to less than about 100 angstroms. Generally barrier layers 20 will be between about 60 and about 100 angstroms in the present invention. It is to be noted that a further advantage to device operation also results from decreasing the thickness of barrier layers 20. More specifically, this decrease in barrier layer thickness widens or broadens the excited state miniband which further improves spectral response and further enhances electron mobility by decreasing electron/proton scattering in the miniband. Although this increase in band width counteracts to some extent the increase in separation between the miniband and the barrier potentials of the barrier layers, the offset is not significant.

By reducing the thickness of the quantum well layers and the barrier layers, the radiation hardness of photodetector 10 is also significantly enhanced. It will be appreciated that radiation hardness is of particular importance in applications involving exposure to high energy radiation which is encountered in space applications.

Although only several periods are shown, it is most preferred that superlattice 16 comprise from about 20 to about a 50 period structure. GaAs quantum well layers 18 are heavily doped n-type with a donor impurity such as Ge, S, Si, Sn, Te or Se. A particularly preferred dopant is Si at a concentration of about $1 \times 10^{18}$ cm$^{-3}$ to about $3 \times 10^{18}$ cm$^{-3}$, and most preferably about $2 \times 10^{18}$ cm$^{-3}$ Contact layer 14 is heavily doped N-type GaAs such that the Fermi level lies within the conduction band of the materials.

Referring now to FIG. 2 of the drawings it will be appreciated that the barrier width is small enough that there is a finite tunneling probability. A single bound state of electrons in the quantum wells is provided above the conduction band of the wells, but below the potential barriers of the barrier layers. In order to provide a periodic energy profile, the compositional and dimensional characteristics of the semiconductor layers which make up superlattice 16 are closely controlled. In this particular example, the energy gap between the bound state and the excited state of electrons in the quantum wells is 100 meV for absorption of long wavelength infrared radiation with peak detection of about 12 µm. Importantly, the first excited state of electrons in the quantum wells lies above the conduction band edge of the barrier layers. To achieve the objects of the present invention, the first excited state of the quantum well electrons should be at least about 30 meV greater than the potential barrier of the barrier layers and will generally be between about 30 meV and 60 meV above the potential barrier of barrier layers 20.

Referring again now to FIGS. 1 and 2 of the drawings, blocking layer 22 is seen interposed between outermost quantum well layer 18a of superlattice 16 and contact layer 24. A second heavily doped n-type contact layer 14 is shown in epitaxial contact with barrier layer 20d. In another arrangement, shown in FIG. 3, blocking layer 22 is positioned at the opposite end of superlattice 16. As will be described more fully hereinafter, in either embodiment blocking layer 22 provides the means by which dark current is significantly reduced in photodetector 10.

Although as stated above, the electron transport properties of superlattice 16 are improved in the present invention by reducing the barrier potential height relative to the first excited or continuum state, generally this also increases tunneling through the individual barrier layers due to the effect of reducing the thickness of the quantum well layers and lowering the barrier potentials. As the quantum well layers are narrowed and the barrier potentials are lowered, the bound state of electrons in the quantum wells moves closer to the conduction band edge of the barriers. This increases tunneling of electrons through the barriers. In order to prevent this increased tunneling from contributing to dark current, blocking layer 22 is provided which is not only substantially thicker than barrier layers 20, but also preferably has a higher potential energy barrier than layers 20. Blocking layer 22 should be at least 300 percent thicker than superlattice barrier layer 20 and in general its thickness can be determined by solving the Schrodinger equation. In this particular embodiment, it is preferred that blocking layer 22 have a thickness of approximately 500 to 2000 angstroms and most preferably approximately 800 angstroms. The potential energy barrier (conduction band edge) of blocking layer 22 is preferably from at least about 10 meV greater than the potential barrier of barrier layers 20 and will generally be between about 10 meV to 30 meV greater.

In order to apply an electrical bias across superlattice 16, a first terminal 26 and a second terminal or detector bias voltage terminal 28 are provided in ohmic contact with contact layers 14 and 24, respectively. Blocking layer 22 is formed of a material which is reasonably well lattice-matched with adjacent quantum well layer 18a of superlattice 16. Most preferably, blocking layer 22 is formed of the same material from which barrier layers 18 are formed, intrinsic $Al_xGa_{1-x}As$ in the most preferred embodiment. As stated, the conduction band edge of blocking layer 22 is significantly lower than the miniband of excited states in the continuum such that electrons in the continuum can move through blocking layer 22 above its potential barrier as shown in FIG. 2. Although not shown in the drawings, if desired, a second blocking layer at the opposite end of the superlattice 16 may be provided such the bias can be reversed while still blocking the tunneling current.

It will be appreciated that it is the presence of this thick blocking layer 22 having a potential barrier greater than that of the individual barrier layers, which reduces dark current in photodetector 10. The distance through blocking layer 22, i.e. the distance between quantum well layer 18a and contact layer 24 is sufficiently large such that electrons within the quantum wells cannot tunnel through the potential energy barrier of blocking layer 22 to reach contact layer 24. That is, blocking layer 22 is sufficiently thick such that substantially all electron tunneling through blocking layer 22 is prevented. Thus, it is the placement of blocking layer 22 in the path of electron flow from quantum well layers 18 to terminal 28 which reduces dark current in the present invention.

In operation, and in accordance with tile method of the present invention, an appropriate detector bias voltage, typically positive and negative voltages near 0 volt, is applied at terminal 26 by voltage source 30 to establish an electric field transverse or perpendicular to superlattice 16 in the direction of blocking layer 22. Terminal 28 is connected to a transimpedance amplifier 34, and its potential at terminal 28 is virtually 0 volt. The voltage at the output of the transimpedance amplifier is measured by voltmeter 32. The output voltage is proportional to the current generated by the detector. The transimpedance amplifier 34 serves to amplify the current generated by the detector and provide the voltage at the output. In order for the thermionic current to be lower than the photon background current, photoconductor 10 is operated at a sufficiently low temperature.

Long wavelength infrared radiation 36 incident on substrate 12 travels through n+ contact layer 14 into superlattice 16. As shown in FIG. 2, photons of the appropriate energy excite electrons 38 in quantum well layers 18 from their bound states to a first excited state in continuum 40. The mean-free path of electrons in the continuum is sufficiently large such that the electrons travel under the applied bias through superlattice 16 to contact layer 24 producing a photocurrent. Due to the relatively low barrier potential of barrier layers 20 and the utilization of InGaAs, electron transport through barrier layers 20 is maximized. The signal representative of the photocurrent is amplified by amplifier 34 and measured by voltmeter instrument 32.

The tunneling component of the dark current which would otherwise reduce the signal-to-noise ratio is effectively eliminated by the presence of blocking layer 22. More specifically, electrons which tunnel through the potential barriers of barrier layers 20 cannot tunnel through blocking layer 22. Since tunneling electrons do not reach contact layer 24, they do not contribute to the dark current. In this fashion, the tunneling current is effectively eliminated. Both quantum efficiency and signal-to-noise ratio are increased by the increased electron mobility.

Figure 3:
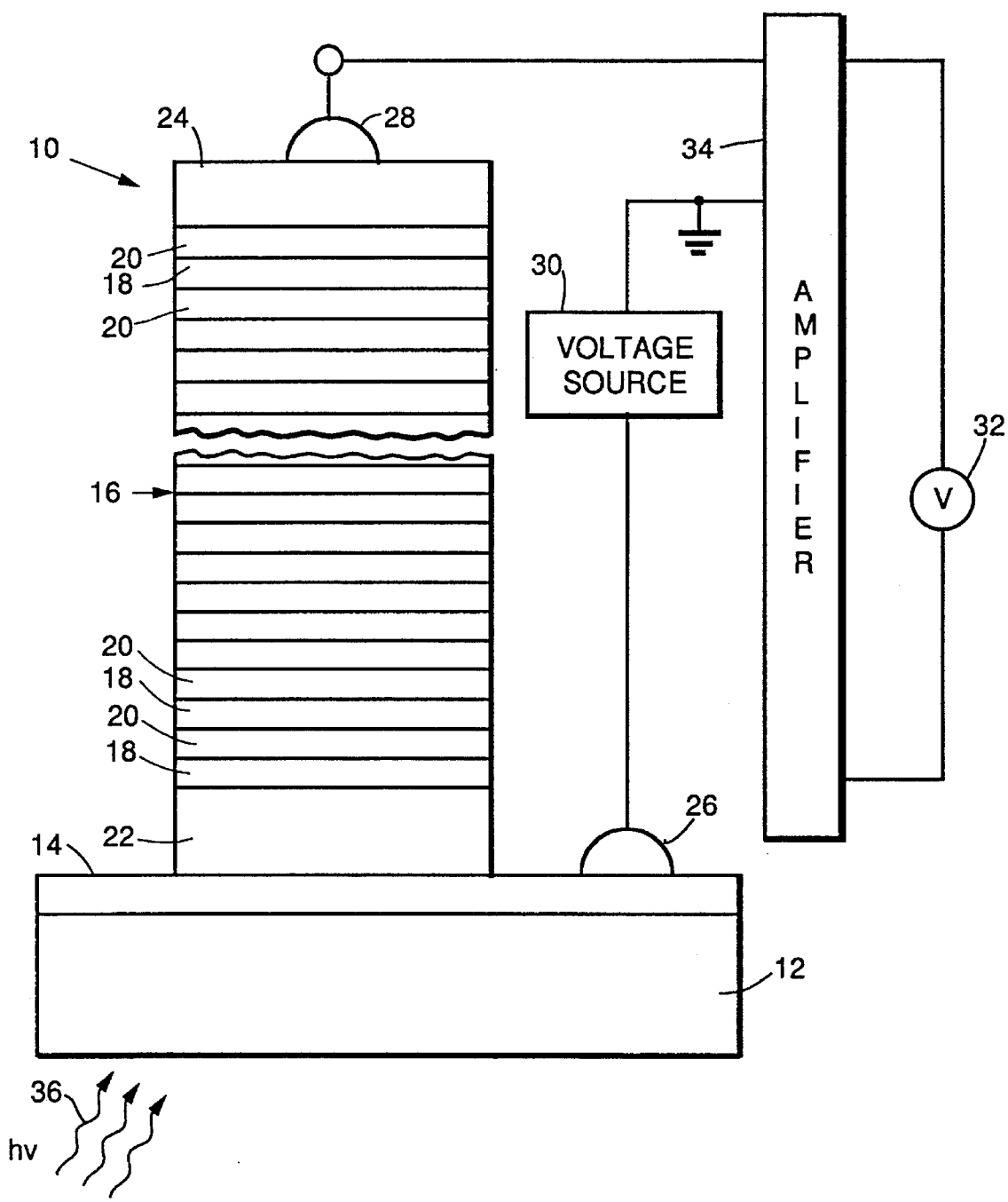
FIG. 3 is a schematic representation of the photodetector of the present invention in another embodiment.

The device shown in FIG. 3, which is most preferred, functions in essentially the same manner; however, the bias is reversed such that photoexcited electrons are collected at contact layer 14.

Thus, it will be appreciated that the present invention is an intra-band or intersub-band device rather than an inter-band device and that the blocking layer permits the selective transport of photoexcited carriers while blocking tunneling electrons. The present invention also facilitates the design of photodetectors having large dynamic ranges and sensitivity. The decreased power dissipation of photodetector 10 also permits focal plane arrays to be constructed which do not produce excessive heat.

Thus, it is apparent that there has been provided in accordance with the invention a method and apparatus that fully satisfies the objects, aims and advantages set forth above. While the invention has been described in connection with specific embodiments thereof, it is evident that many alternatives, modifications, and variations will be apparent to those skilled in the art in light of the foregoing description. Accordingly, it is intended to embrace all such alternatives, modifications and variations that fall within the spirit and broad scope of the appended claims.

What is claimed is:

1. A semiconductor photodetector, comprising:
a plurality of quantum well layers and barrier layers alternatively arranged in a periodic superlattice structure to absorb photons of a preselected wavelength, said barrier layers formed of $Al_xGa_{1-x}As$, where x is from 0.0 to 0.25, each having a preselected potential energy barrier;
first and second contact layers of heavily doped n-type semiconductor material disposed on opposite ends of said periodic superlattice structure; and
electrons disposed within said quantum well layers, said electrons having a bound state below the potential energy barriers of said barrier layers, the closest excited state to the bound state being above said potential energy barriers of said barrier layers, said excited state being at least 30 meV greater than said potential energy barriers.

2. The photodetector recited in claim 1, further including a blocking layer located at one end of said periodic superlattice structure and between said contacts, said blocking layer having a thickness which is substantially greater than the thickness of said barrier layers.

3. The photodetector recited in claim 1, wherein said quantum well layers each have a thickness of from about 30 to about 45 angstroms.

4. The photodetector recited in claim 1, wherein said quantum well layers are formed of a semiconductor material selected from the group consisting of GaAs and InGaAs.

5. The photodetector recited in claim 4, wherein said semiconductor material is $In_xGa_{1-x}As$, where x is from about 0.1 to about 0.2.

6. A semiconductor photodetector, comprising:
a plurality of quantum well layers and barrier layers alternatively arranged in a periodic superlattice structure to absorb photons of a preselected wavelength, the quantum well layers each having a thickness of from 30 to 45 angstroms, said barrier layers each having a preselected potential energy barrier;
first and second contact layers of heavily doped n-type semiconductor material disposed on opposite ends of said periodic superlattice structure; and
electrons disposed within said quantum well layers, said electrons having a bound state below the potential energy barriers of said barrier layers, the closest excited state to the bound state being above said potential energy barriers of said barrier layers, said excited state being at least 30 meV greater than said potential energy barriers.

7. A semiconductor photodetector, comprising:
a plurality of quantum well layers and barrier layers alternatively arranged in a periodic superlattice structure to absorb photons of a preselected wavelength, said barrier layers each having a thickness of from 60 to 100 angstrom and each having a preselected potential energy barrier;
first and second contact layers of heavily doped n-type semiconductor material disposed on opposite ends of said periodic superlattice structure; and
electrons disposed within said quantum well layers, said electrons having a bound state below the potential energy barriers of said barrier layers, the closest excited state to the bound state being above said potential energy barriers of said barrier layers, said excited state being at least 30 meV greater than said potential energy barriers.

8. The photodetector recited in claim 1, wherein said barrier layers have a thickness of from about 60 to about 100 angstroms.

9. The photodetector recited in claim 2, wherein said blocking layer is $Al_xGa_{1-x}As$, where x is about 0.1 to about 0.35.

10. The photodetector recited in claim 2, further including means for applying an electrical field across said periodic superlattice structure and said blocking layer.

11. The photodetector recited in claim 1, further including means for sensing an electrical signal in response to radiation incident on said superlattice structure.

12. The photodetector recited in claim 1, wherein said photodetector is an infrared photodetector and the energy gap between said bound state and said excited state is resonant with the energy of a preselected wavelength of infrared radiation.

13. The photodetector recited in claim 1, wherein said quantum well layers are doped heavily n-type.

14. The photodetector recited in claim 2, wherein the thickness of said blocking layer is at least about 300 percent greater than the thickness of said barrier layers.

15. The photodetector recited in claim 6, wherein said superlattice is formed from materials selected from the group consisting of III–V, IV—IV and II–IV materials.

16. The photodetector recited in claim 2, further including a second blocking layer disposed at the other end of said superlattice structure.

17. The photodetector recited in claim 2, wherein said blocking layer has a preselected potential energy barrier at least approximately 10 meV greater than that of said barrier layers.

18. The photodetector recited in claim 6, wherein said quantum well layers are $In_xGa_{1-x}As$, where x is about 0.1 to about 0.2, said barrier layers are $Al_xGa_{1-x}As$, where x is about 0 to about 0.1, and said blocking layer is $Al_xGa_{1-x}As$, where x is about 0.1 to about 0.2.

19. The photodetector recited in claim 1, wherein said quantum well layers are doped n-type to between about $1\times10^{18}$ cm$^{-3}$ and $3\times10^{18}$ cm$^{-3}$.

20. The photodetector recited in claim 1, further including a plurality of said photodetectors arranged in a focal plane array.

21. The photodetector recited in claim 1, wherein said energy spacing between said bound state and said excited state is approximately 100 meV and said preselected wavelength is 12 μm.

22. The photodetector recited in claim 2, wherein said barrier layers are from about 60 angstroms to about 100 angstroms in thickness, said quantum well layers are from about 30 angstroms to about 45 angstroms in thickness and said blocking layer is from about 500 angstroms to about 2000 angstroms in thickness.

23. A radiation-hard, low-dark current infrared photodetector, comprising:

a plurality of interleaved quantum well layers and barrier layers forming a multiquantum well superlattice structure, said superlattice structure having a predetermined resistance to a preselected electrical bias applied across said superlattice in the direction transverse to said layers, said barrier layers having predetermined potential energy barriers, and said quantum well layers having a thickness of from about 30 to about 45 angstroms;

electrons confined in quantum wells in said quantum well layers, said electrons being resonant with radiation having a preselected wavelength such that said electrons are excited out of said quantum wells to a predetermined energy state above the conduction band edge of said barrier layers to decrease the resistance of said superlattice structure, said predetermined excited state being at least 30 meV greater than said predetermined potential energy barriers of said barrier layers;

a blocking layer disposed on one end of said superlattice structure, said blocking layer having a thickness which reduces tunneling of charge carriers in said superlattice to a greater extent than the individual barrier layers, thereby reducing said dark current of said photodetector; and a potential energy height which is greater than that of said barrier layers.

24. A semiconductor photodetector, comprising:

a substrate of semi-insulating semiconductor material;

a first contact layer of heavily doped n-type semiconductor material disposed on said substrate;

a multiquantum well superlattice structure composed of a plurality of alternating quantum well layers and barrier layers disposed on said first contact layer, said barrier layers each having a thickness of from 60 to 100 angstroms and each having a predetermined potential energy barrier;

electrons disposed within said quantum well layers, said electrons having a bound state below the potential energy barriers of said barrier layers, the closest excited state to said bound state being above said potential energy barriers of said barrier layers;

a tunneling current blocking layer disposed on said multiquantum well superlattice, said blocking layer having a predetermined potential energy barrier at least 10 meV greater than said predetermined potential energy barrier of said barrier layers and below said excited state; and a second contact layer of heavily doped n-type semiconductor material disposed on said tunneling current blocking layer.

25. The photodetector recited in claim 24, wherein said quantum layers each have a thickness of from about 30 to about 45 angstroms.

26. The photodetector recited in claim 24, wherein said quantum layers are formed of a semiconductor material selected from the group consisting of GaAs and InGaAs.

27. The photodetector recited in claim 24, wherein said semiconductor material is $In_xGa_{1-x}As$, where x is from about 0.1 to about 0.2.

28. The photodetector recited in claim 24, wherein said barrier layers are formed of a semiconductor material selected from the group consisting of GaAs and AlGaAs.

29. The photodetector recited in claim 24, wherein said barrier layers are formed of $Al_xGa_{1-x}As$, where x is from about 0.0 to about 0.25.

30. A semiconductor photodetector, comprising:

a plurality of quantum well layers and barrier layers alternatively arranged in a periodic superlattice structure to absorb photons of a preselected wavelength, said barrier layers each having a preselected potential energy barrier;

first and second contact layers of heavily doped n-type semiconductor material disposed on opposite ends of said periodic superlattice structure;

a blocking layer located at one end of said periodic superlattice structure and between said contacts, said blocking layer having a thickness which is substantially greater than the thickness of said barrier layers, and electrons disposed within said quantum well layers, said electrons having a bound state below the potential energy barriers of said barrier layers, the closest excited state to the bound state being above said potential energy barriers of said barrier layers, said excited state being at least 30 meV greater than said potential energy barriers, wherein said quantum well layers are $In_xGa_{1-x}As$, where x is 0.1 to 0.2, said barrier layers are $Al_xGa_{1-x}As$, where x is 0 to 0.1, and said blocking layer is $Al_xGa_{1-x}As$, where x is 0.1 to 0.2.

31. The photodetector recited in claim 24, wherein said blocking layer is $Al_xGa_{1-x}As$, where x is about 0.1 to about 0.35.

\* \* \* \* \*